US005774016A

United States Patent [19]

Ketterer

[11] Patent Number: 5,774,016

[45] Date of Patent: Jun. 30, 1998

[54] AMPLIFIER SYSTEM HAVING PRIORITIZED CONNECTIONS BETWEEN INPUTS AND OUTPUTS

[75] Inventor: Ernest R. Ketterer, Lincoln Park, N.J.

[73] Assignee: Bogen Corporation, Ramsey, N.J.

[21] Appl. No.: 633,837

[22] Filed: Apr. 9, 1996

[51] Int. Cl.[6] .......... H03F 3/68

[52] U.S. Cl. .......... 330/51; 330/124 R; 330/295

[58] Field of Search .......... 330/51, 124 R, 330/144, 145, 284, 295; 381/80, 81, 85

[56] References Cited

U.S. PATENT DOCUMENTS

| | | | |
|---|---|---|---|
| 4,149,032 | 4/1979 | Peters | 330/124 R X |
| 5,586,114 | 12/1996 | Uhling et al. | 330/124 R X |

OTHER PUBLICATIONS

Brochure dated Apr. 95 for the CP62 Commercial Processor by the Rane Corporation.

*Primary Examiner*—James B. Mullins

*Attorney, Agent, or Firm*—McDermott, Will & Emery

[57] ABSTRACT

An amplifier system is disclosed. The amplifier system includes a plurality of input terminals and a plurality of amplifier channels. It further discloses switching means for selectably connecting each of the plurality of input terminals to each of the plurality of amplifier channels when the input terminal is active, prioritizing means for prioritizing the connection of each of the plurality of input terminals to each of the plurality of amplifier channels and control means for controlling the switching means in accordance with the means for prioritizing the connection so that for each amplifier channel, the active input terminal with the highest priority is connected to the amplifier channel. Also disclosed are means for limiting the output level of each amplifier channel in accordance with the input terminal that is connected to the amplifier channel.

8 Claims, 4 Drawing Sheets

| | | AMPLIFIER 1 | AMPLIFIER 2 | AMPLIFIER 3 |
|---|---|---|---|---|
| INPUTS | AUDIO INPUT | BAR | WAITING ROOM | DINING ROOM |
| AUX A | JUKEBOX | 2 | NA | NA |
| AUX B | CD PLAYER | 4 | 2 | 1 |
| AUX C | TV | 3 | NA | NA |
| AUX D | BACKGROUND | NA | 3 | 2 |
| MIC A | PAGER | 1 | 1 | NA |
| MIC B/TEL B | | NA | NA | NA |

FIG. 5

AMPLIFIER SYSTEM HAVING PRIORITIZED CONNECTIONS BETWEEN INPUTS AND OUTPUTS

BACKGROUND OF THE INVENTION

The present invention relates to sound systems. More specifically, it relates to sound systems for use in public areas having more than one room, for example, in restaurants.

Public places, such as a restaurant often have different rooms wherein it is desired to provide different audio tracks and other announcements from a sound system. For example, the audio requirements will generally differ for a bar, for a waiting room, for the kitchen and for the dining area. Existing sound systems, however, offer limited features and capabilities to meet the needs of the marketplace.

Thus, new sound systems for use in public places are needed.

SUMMARY OF THE INVENTION

The present invention is a new and improved amplifier system. The amplifier system includes a plurality of input terminals and a plurality of amplifier channels. It also includes switching means for selectably connecting each of the plurality of input terminals to each of the plurality of amplifier channels when the input terminal is active, means for prioritizing the connection of each of the plurality of input terminals to each of the plurality of amplifier channels and control means for controlling the switching means in accordance with the means for prioritizing the connection so that for each amplifier channel, the active input terminal with the highest priority is connected to the amplifier channel. The present invention also includes means for limiting the output level of each amplifier channel in accordance with the input terminal that is connected to the amplifier channel.

The invention will now be further described in connection with certain illustrated embodiments; however, it should be clear to those skilled in the art that various modifications, additions and subtractions can be made without departing from the spirit and scope of the claims.

DESCRIPTION OF THE DRAWINGS

FIGS. 4 and 5 illustrate the use of the amplifier system of the present invention to prioritize a typical set of audio signals in a restaurant environment.

DESCRIPTION OF THE PREFERRED EMBODIMENT

Figure 1:
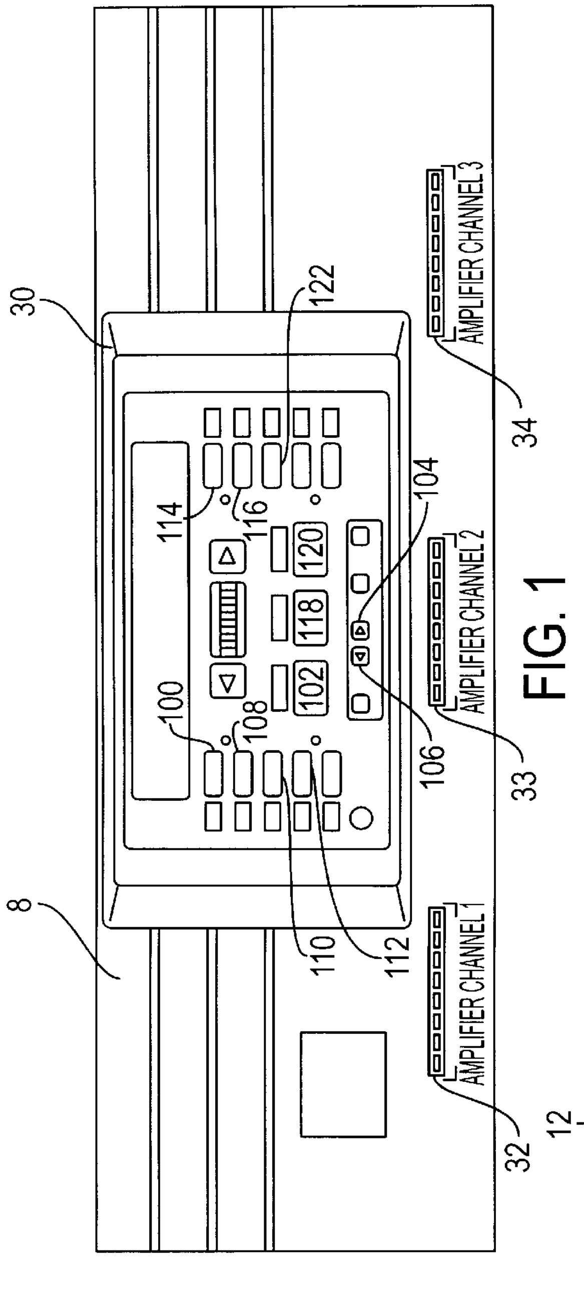
FIGS. 1 and 2 illustrate the front and rear panels, respectively, of the amplifier system of the present invention.
Figure 2:
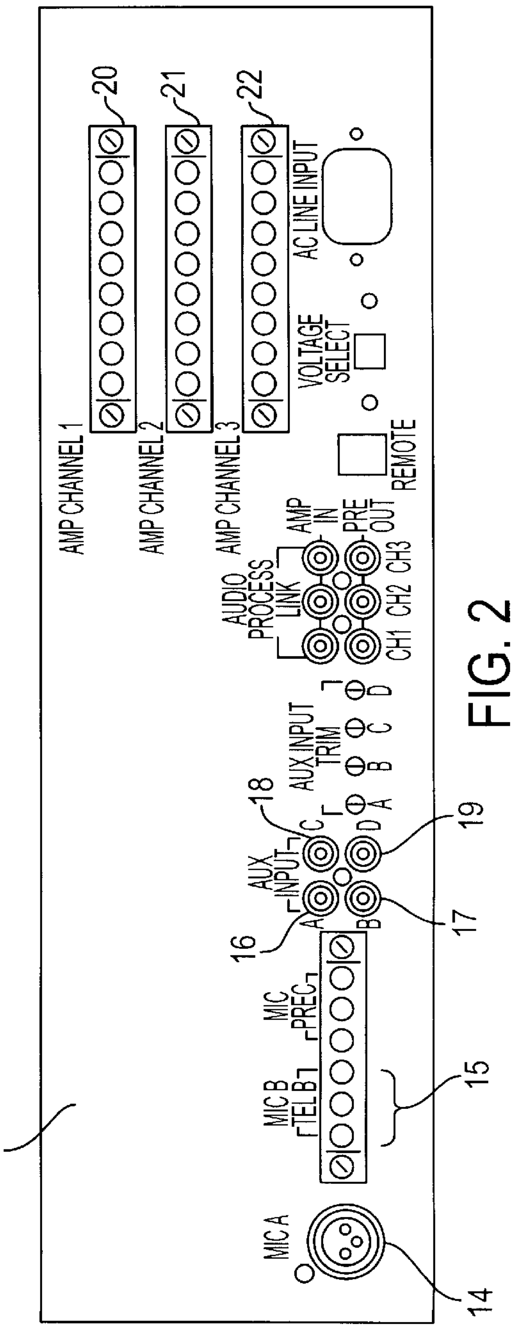

In FIGS. 1 and 2, the front 8 and rear 12 panels, respectively, of the amplifier system of the present invention are illustrated. The rear panel 12 provides the following input terminals: MIC A 14, MIC B/TEL B 15, AUX INPUT A 16, AUX INPUT B 17, AUX INPUT C 18 and AUX INPUT D 19. Various sources of audio signals can be connected to these input terminals. For example, a microphone from a paging system can be connected to the MIC A input terminal 14 so that announcements can be made through the amplifier system. A second microphone or a telephone can be connected to the MIC B/TEL B input terminal. A variety of audio components, such as CD players, tape players, jukeboxes, etc., can be connected to each of the auxiliary input terminals AUX INPUT A–D 16 to 19, to provide audio signals from a variety of sources.

The rear panel 12 also provides output strips 20 to 22 for three amplifier channels, AMP CHANNEL 1, AMP CHANNEL 2 and AMP CHANNEL 3. Each of these output strips 20 to 22 provides an output from one of the amplifier channels as well as the ability to control certain aspects of the amplifier channel.

The rear panel 12 also provides various other standard connection terminals and/or control devices. For example, AUX INPUT TRIM controls, AUDIO PROCESS LINK connectors, and an AC LINE INPUT connector are provided. These are utilized for providing conventional functions.

The front panel 8 includes a control panel 30. The control panel 30 is preferably removable and can also be controlled via a remote infrared link. The front panel 10 also preferably includes output level indicators 32 to 34 for the three amplifier channels, AMP CHANNEL 1, AMP CHANNEL 2 and AMP CHANNEL 3.

Figure 3:
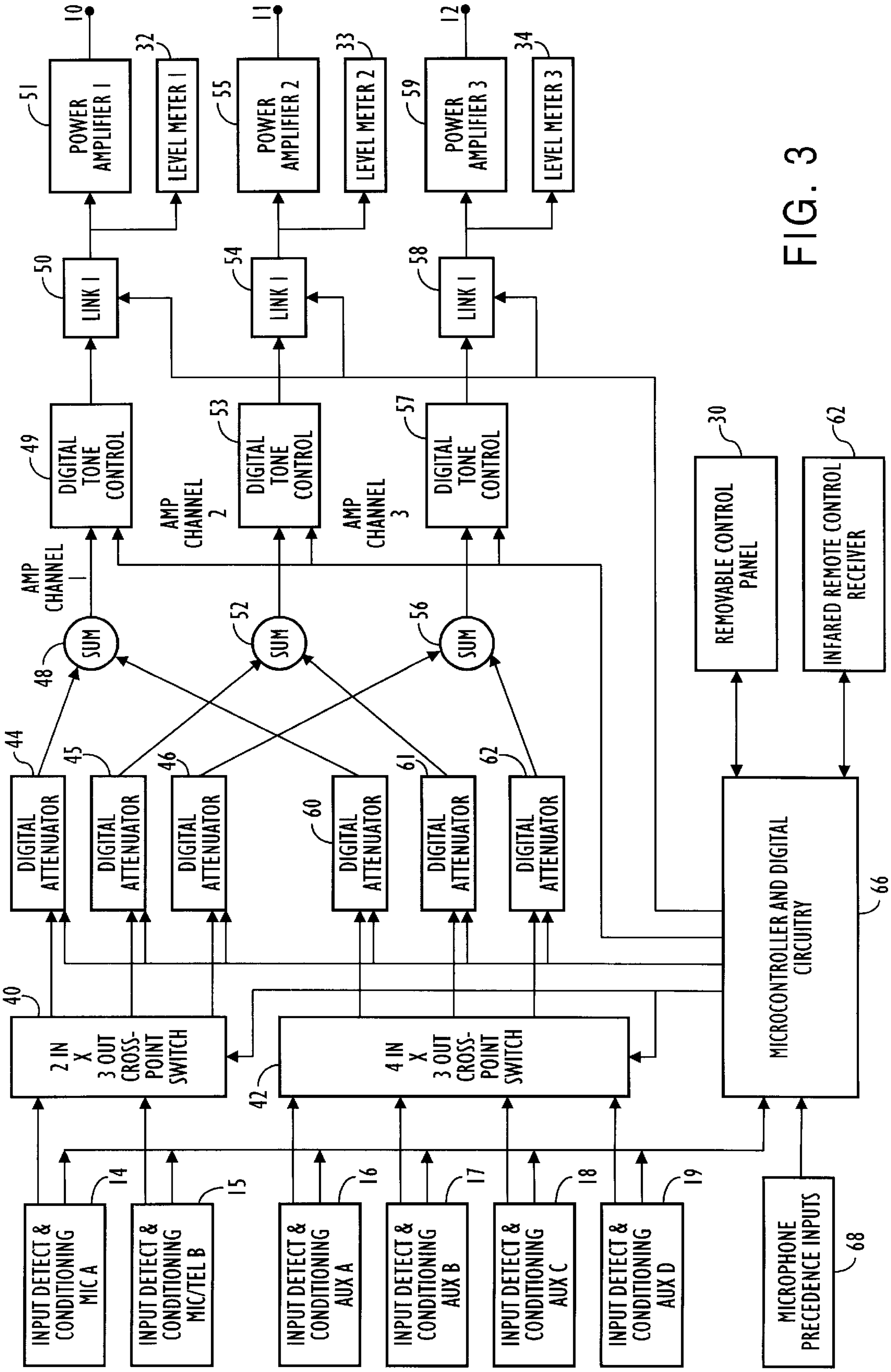
FIG. 3 illustrates the circuitry of the amplifier system in accordance with a preferred embodiment of the present invention.

Referring now to FIG. 3, the circuitry in accordance with a preferred embodiment of the present invention is illustrated. The input terminals 14 to 19, including the MIC A input, the MIC B/TEL B input, and the AUX INPUT A–D lines, are all connected to inputs on crosspoint switches 40 and 42 which can connect any switch input to any switch output.

In particular, the input terminals 14 and 15 are connected to the two inputs to the 2×3 crosspoint switch 40. The three outputs from the crosspoint switch 40 are connected to digital attenuators 44 to 46. The digital attenuator 44 is connected to the first amplifier channel, AMP CHANNEL 1, that includes the following components: a summer 48, a digital tone control circuit 49, a link circuit 50 and a 100 watt power amplifier circuit 51. The digital attenuator 45 is connected to the second amplifier channel, AMP CHANNEL 2, that includes the following components: a summer 52, a digital tone control circuit 53, a link circuit 54 and a 60 watt power amplifier circuit 55. The digital attenuator 46 is connected to the third amplifier channel, AMP CHANNEL 3, that includes the following components: a summer 56, a digital tone control circuit 57, a link circuit 58 and a 20 watt power amplifier circuit 59. Since the power amplifiers 51, 55 and 59 provide outputs at amplifier output terminals 10 to 12, respectively, it is apparent that the input terminals 14 and 15 can be connected to all three power amplifiers 51, 55 and 59 and, then, to all three output terminals 10 to 12.

The input terminals 16 to 19 are connected to the four inputs in the 4×3 crosspoint switch 42. The three outputs from the crosspoint switch 20 are connected to digital attenuators 60 to 62. The digital attenuator 60 is connected to the first amplifier channel, AMP CHANNEL 1, that, as previously explained, includes the summer 48, the tone control circuit 49, the link circuit 50 and the power amplifier circuit 51 and that provides an output at terminal 10. The digital attenuator 61 is connected to the second amplifier channel, AMP CHANNEL 2, that, as previously explained, includes the summer 52, the tone control circuit 53, the link circuit 54 and the power amplifier circuit 55 and that provides an output at the terminal 11. The digital attenuator 62 is connected to the third amplifier channel, AMP CHANNEL 3, that, as previously described, includes the summer 56, the tone control circuit 57, the link circuit 58 and the power amplifier circuit 59 and that provides an output at the terminal 12. Thus, the input terminals 16 to 19 can be connected to all three power amplifiers 51, 55 and 59 and, then, to all three output terminals 10 to 12.

The embodiment of FIG. 3 uses two crosspoint switches 40 and 42 to provide the capability of connecting each input terminal to each amplifier circuit, necessitating the use of summers 28, 32 and 36. If a single crosspoint switch that is large enough to handle the connection of all inputs to all outputs and that has the necessary ratings can be used, it is apparent that the summers can be eliminated.

A microcontroller based circuit 66 is provided. The microcontroller circuit 66 receives inputs from the input terminals 14 to 19, from microphone precedence inputs 68 and from the control panel 30 and the infrared receivers 67. The microcontroller circuit 66 controls the operation of various components in FIG. 3 based on these inputs.

For example, the microcontroller circuit 66 provides outputs to the crosspoint switches 40 and 42 to control the input to output connections that are made in each switch 40 and 42. The microcontroller circuit 66 also provides outputs to the digital attenuators 44 to 46 and 60 to 61 to control the attenuation levels of each of these devices. The microcontroller 66 also provides control signals to the digital tone control circuits 49, 53 and 57. The microcontroller circuit 66 also controls the link circuits 50, 54 and 58. These link circuits 50, 54 and 58 function as a switch to internally connect or disconnect the front end audio processing circuitry from the power amplifier circuitry. Connectors, not shown in FIG. 3, are preferably provided to allow external access to the front end processing signal outputs and power amplifier inputs. So, for example, the front end signal processing circuits can be connected to external power amplifiers, if desired.

Figure 4:
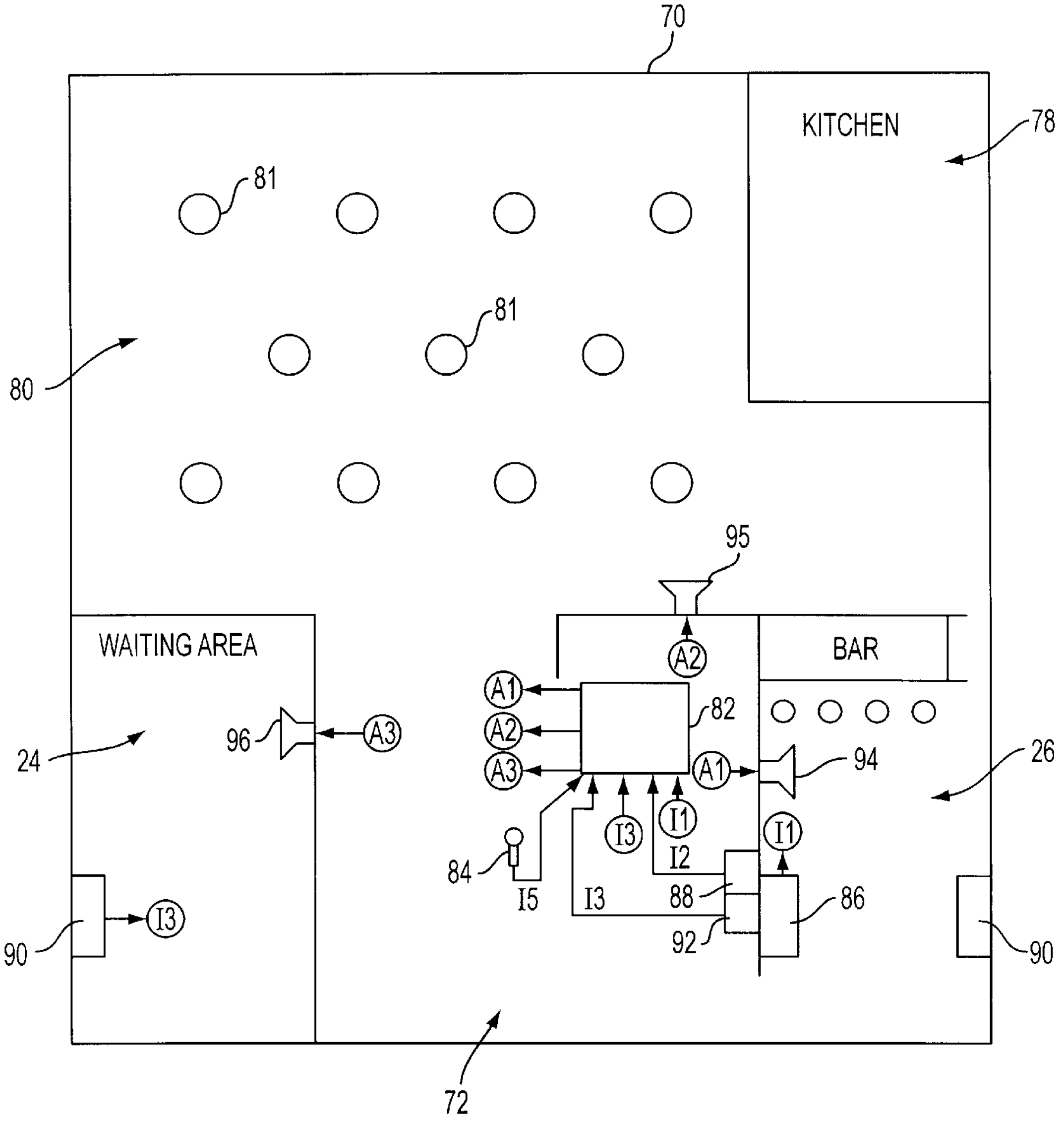

Referring now to FIGS. 4 and 5, one typical use of the amplifier system in a restaurant setting is illustrated. In FIG. 4, a restaurant 70 has a greeting area 72, a waiting area 74, a bar area 76, a kitchen 78 and a dining area 80 that includes a plurality of tables 81. The amplifier system 82 of the present invention is preferably, but not necessarily, located near the greeting area 72. Note that FIG. 4 exaggerates the space consumed by the amplifier system 82—ordinarily it will be built into a hidden closet.

A microphone 84 from a paging system, a jukebox 86, a CD player 88, a TV 90 and a source of background music 92 are connected to the inputs of the amplifier system 82. Specifically, as indicated in FIGS. 4 and 5, the microphone 84 is connected to the MIC A input terminal 14 on the line I5, the jukebox 86 is connected to the AUX INPUT A terminal 16 on the line I1, the CD player 88 is connected to the AUX INPUT B terminal 17 on the line I2, the TV is connected to the AUX INPUT C terminal 18 on the line I3, and the background audio source 92 is connected to the AUX INPUT D terminal 19 on the line I4.

Audio is provided to the restaurant rooms via a set of speaker systems 94 to 96. For example, in FIG. 4, speaker systems 94, 95 and 96 are provided for the bar 76, the dining area 80 and the waiting room 74, respectively. The speaker system 94 is connected to the first amplifier output terminal 10 on the amplifier system 82 via a line A1. The speaker system 95 is connected to the third amplifier output terminal 12 on the amplifier system 82 via a line A2. The speaker system 96 is connected to the second amplifier output terminal 11 on the amplifier system 82 via a line A3. Of course, these connections can be modified to take advantage of the different power ranges of the amplifier channels.

Note that the kitchen area 78 is not provided with a speaker system. If it is desired to do so, either one of the speaker systems already described can be installed in the kitchen area 78 or, alternatively, the amplifier system 82 could be modified within the boundaries of the present invention to provide a fourth amplifier channel which could handle a fourth speaker system. Additional amplifier channels can also be easily added.

In accordance with one aspect of the present invention, the connection of each of the audio signals on the input terminals 14 to 19 to each of the amplifier output terminals 10 to 12 can be prioritized. To do so, a user of the amplifier system 82 accesses the control panel 30. Each combination of input and output can be selected via the buttons on the control panel 30. For example, to assign the priority for the audio input on the AUX INPUT A line on the first amplifier channel output 10, the AUX A button 100 and the AMP 1 button 102 are selected. Then the NEXT and BACK buttons 104 and 106 are used to set the priority level.

In a similar manner, the priority of any input on any output can be set by accessing the appropriate combination of the input control buttons AUX A 100, AUX B 108, AUX C 110, AUX D 112, MIC A 114 and MIC B 116 and of the output control buttons AMP 1 102, AMP 2 118 and AMP 3 120 and then using the NEXT and BACK buttons 104 and 106.

This priority information is sent to the microcontroller circuit 66 and is preferably stored in a priority table. The microcontroller circuit 66 then accesses the priority table to determine the appropriate connections to be made in the crosspoint switches 40 and 42. Thus, for each amplifier channel, AMP CHANNEL 1, AMP CHANNEL 2 and AMP CHANNEL 3, the input with the highest priority on that channel is connected.

The microcontroller circuit 66 also receives inputs from the input terminals 14 to 19. These inputs allow the microcontroller circuit 66 to determine which input terminals have active audio signals on them. Conventional circuitry, using op amps, rectifiers, filters and comparators, is utilized to perform this function. The microcontroller circuit 66, before connecting an input to an output in accordance with the priority table, ensures that there is an active signal an the input terminal.

Referring now to FIG. 5, a chart illustrating the use of the amplifier system 82 to control the presentation of various the audio sources in the different rooms of the restaurant 70 is shown. The priorities on the amplifier outputs 10 to 12 are set by accessing the buttons on the control panel 30, as previously discussed.

In FIG. 5, the priorities on the first amplifier 51 (in AMP CHANNEL 1) are shown to have been set so that the pager 84 has highest priority, the jukebox 86 has the second highest priority, the TV 90 has the third highest priority and the CD player 88 has the lowest priority. The background music source 92 is not enabled on the first amplifier 51. Thus, in the bar 76, the CD player 88 will be broadcast on the speaker system 94 only if the jukebox 86, the TV 90 and the pager 84 are not active. If the TV 90 is turned on and the jukebox 86 and the pager 84 are not active, then the TV audio signal will be broadcast instead of the CD player, as it has a higher priority. If the jukebox 86 is selected by a patron but the pager 84 is not active, then the audio from the jukebox 86 is broadcast instead of the lower priority audio sources. Lastly, when the pager 84 is enabled, presumably to announce that a table is ready, the audio signal from the pager 84 is broadcast, regardless of the status of the other audio sources.

The priorities on the third amplifier channel 59 in AMP CHANNEL 3, which provides service to the speaker circuit 95 in the dining room 80, are set so that the audio from the background music source 92 is broadcast over the speaker circuit 95 if the CD player 88 is inactive. If, however, the CD player 88 is enabled, then its audio is broadcast instead, as it has a higher priority.

The priorities on the second amplifier channel 55, which provides service for the waiting room 74, are similar to those for the dining room 80, except the pager 84 is given the highest priority. Thus, when enabled, the pager 84 audio will be broadcast on the speaker system 96. When the pager 94 is not enabled, the CD player 88 audio is broadcast if the CD player 88 is enabled. If the pager 94 and the CD player 88 are not enabled, then the audio from the background source 92 is broadcast.

Referring back to FIG. 3, the microcontroller circuit 66 can also control the output level of each of the amplifier channels 51, 55 and 59 in accordance with the input terminal 14 to 19 that is connected to the amplifier channel 51, 55, and 59. The operator of the amplifier 82 can assign a volume setting for each combination of input terminals 14 to 19 and amplifier channel outputs 10 to 12 by using the buttons on the control panel 30, including the input and amplifier buttons previously discussed and the VOL button 122. The microcontroller circuit 66 stores this information in a look up table for use as connections between the various inputs and the various outputs are being made.

As the microcontroller circuit 66 is connecting the input terminals 14 to 19 to the amplifier channels 51, 55 and 59, it also looks up the desired volume settings as set from the control panel 30. If no setting is found, a default setting will be used. The microcontroller circuit 66 will set the attenuation in the attenuators 44 to 46 and 60 to 62 in accordance with the desired volume settings.

When the microcontroller circuit 66 changes from a lower to a higher priority input on any given amplifier channel, any user preset volume differences between the lower and the higher priority inputs are changed immediately. If, however, the microcontroller circuit 66 determines that a change from a higher priority input to a lower priority input needs to be made, for example, when the higher priority input becomes inactive, the microcontroller circuit 66 implements slightly different processing steps. First, before switching to the lower priority input, the microcontroller circuit 66 waits a preset amount of time to ensure that the higher priority input is truly inactive, thereby avoiding unwanted switching during a transient silent period on the higher priority audio source. It is preferred to wait eight seconds before switching from a higher priority source on the auxiliary inputs and three seconds before switching from a higher priority source on the microphone inputs. Although these times are presently hardcoded, in an alternate embodiment, these times can be changed by the user through the front panel 30. Once the microcontroller 66 decides to make the change to a lower priority audio source, it sets the volume of the lower priority audio source to zero and then ramps or fades the volume level back to its previous level or its preselected level.

The circuit of the present invention can also provide a "page over music" feature. Referring to FIG. 3, the use of a separate bank of digital attenuators (44 to 46 versus 60 to 62) to control the microphone inputs and the auxiliary inputs permits the microcontroller 66 to lower the volume of an auxiliary input (with music on it) and mix the auxiliary input with the microphone input at one of the summers 48, 52 or 56. Thus, a page from a microphone input can be broadcast while music from an auxiliary input continues to play.

It is understood that changes may be made in the above description without departing from the scope of the invention. It is accordingly intended that all matter contained in the above description and in the drawings be interpreted as illustrative rather than limiting.

I claim:

1. An amplifier system, comprising:

a plurality of input terminals;

a plurality of amplifier channels;

switching means for selectably connecting each of the plurality of input terminals to each of the plurality of amplifier channels when the input terminal is active;

means for prioritizing the connection of each of the plurality of input terminals to each of the plurality of amplifier channels; and control means for controlling the switching means in accordance with the means for prioritizing the connection so that for each amplifier channel, the active input terminal with the highest priority is connected to the amplifier channel.

2. The claim of claim 1, further comprising:

means for limiting the output level of each amplifier channel in accordance with the input terminal that is connected to the amplifier channel.

3. A method of providing audio signals through an amplifier system having a plurality of input terminals and a plurality of amplifier channels, comprising the steps of:

prioritizing the connection of each of the plurality of input terminals to each of the plurality of amplifier channels;

controlling the connection of each of the plurality of input terminals to each of the plurality of amplifier channels in accordance with the priority from the previous step, so that for each amplifier channel, the active input terminal with the highest priority is connected to the amplifier channel.

4. The claim of claim 3, further comprising the step of:

limiting the output level of each amplifier channel in accordance with the input terminal that is connected to the amplifier channel.

5. An amplifier system, comprising:

a plurality of input terminals;

a plurality of amplifier channels;

switching means for selectably connecting each of the plurality of input terminals to each of the plurality of amplifier channels; and control means for controlling the output level of each of the amplifier channels in accordance with the input terminal that is connected to the amplifier channel.

6. An amplifier circuit, comprising:

a plurality of input terminals;

a crosspoint switch having a plurality of inputs and outputs, each of the input terminals being connected to an input on the crosspoint switch, the crosspoint switch being able to connect each of its inputs to each of its outputs;

an attenuator connected to each output of the crosspoint switch;

an amplifier circuit connected to an output of each attenuator;

a microcontroller that controls the operation of the crosspoint switch wherein the microcontroller receives inputs from the plurality of input terminals so that it can determine which input terminals have an active audio signal, wherein the microcontroller maintains a table indicative of the priority each input terminal has on each amplifier circuit and wherein the microcontroller connects input terminals with active audio signals to the amplifier circuits in accordance with the priority table.

7. The claim of claim 6, further comprising:

the microcontroller controls the attenuation in the attenuators and the connections made by the crosspoint switch.

8. The claim of claim 7, wherein the attenuation in each attenuator is assigned by the microcontroller in accordance with the input terminal that is being connected through the crosspoint switch to the attenuator.

* * * * *